(12) United States Patent
Lim et al.

(10) Patent No.: US 8,829,691 B2
(45) Date of Patent: Sep. 9, 2014

(54) LIGHT-EMITTING DEVICE PACKAGE AND METHOD OF MANUFACTURING THE SAME

(75) Inventors: Jae-yun Lim, Hwaseong-si (KR); Kook-jin Oh, Asan-si (KR); Joon-gil Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 110 days.

(21) Appl. No.: 13/244,510

(22) Filed: Sep. 25, 2011

(65) Prior Publication Data

US 2012/0175665 A1 Jul. 12, 2012

(30) Foreign Application Priority Data

Jan. 7, 2011 (KR) .................. 10-2011-0001793

(51) Int. Cl.
*H01L 23/48* (2006.01)
*H01L 21/44* (2006.01)

(52) U.S. Cl.
USPC ............... 257/784; 257/692; 257/E33.066; 257/E21.509; 438/121; 438/617

(58) Field of Classification Search
CPC .......... H01L 24/48; H01L 24/85; H01L 33/62
USPC .............. 257/692, 696, 784, 99, E33.066, 257/E21.509; 438/121, 617
See application file for complete search history.

(56) References Cited

U.S. PATENT DOCUMENTS

| 6,380,634 B1 * | 4/2002 | Umehara ................. 257/784 |
| 6,933,608 B2 * | 8/2005 | Fujisawa ................. 257/738 |
| 8,022,429 B2 * | 9/2011 | Ueji et al. ............... 257/98 |
| 8,183,684 B2 * | 5/2012 | Nakazato ................ 257/692 |

FOREIGN PATENT DOCUMENTS

| KR | 2002-0016083 A | 3/2002 |
| KR | 10-2007-0074489 A | 7/2007 |
| KR | 10-2008-0077900 A | 8/2008 |

\* cited by examiner

*Primary Examiner* — Jose R Diaz
(74) *Attorney, Agent, or Firm* — Sughrue Mion, PLLC (57) ABSTRACT

A light-emitting device package includes: a package body on which a mount portion and a terminal portion are disposed; a light-emitting device chip that is mounted on the mount portion; and a bonding wire that electrically connects an electrode of the light-emitting device chip and the terminal portion. The bonding wire includes a rising portion that rises from the light-emitting device chip to a loop peak, and an extended portion that connects the loop peak and the terminal portion. A first kink portion, which is bent in a direction intersecting a direction in which the rising portion rises, is disposed on the rising portion.

8 Claims, 6 Drawing Sheets

LIGHT-EMITTING DEVICE PACKAGE AND METHOD OF MANUFACTURING THE SAME

CROSS-REFERENCE TO RELATED APPLICATIONS

This application claims the benefit of Korean Patent Application No. 10-2011-0001793, filed on Jan. 7, 2011, in the Korean Intellectual Property Office, the disclosure of which is incorporated herein in its entirety by reference.

BACKGROUND

1. Field

The present disclosure relates to light-emitting device packages and methods of manufacturing the same.

2. Description of the Related Art

Light-emitting device chips, for example, light emitting diodes (LEDs), refer to semiconductor devices that may create various colors of light by constituting a light-emitting source through a PN junction of a compound semiconductor. LEDs have advantages in that they have a long lifespan, are easily made small and light, have a strong directivity of light, and are driven at a low voltage. Also, LEDs may be applied in various fields because they are strong against impact and vibration, do not need to be preheated, are driven in a simple way, and are packaged in various forms.

Light-emitting device chips, such as LEDs, are manufactured as a light-emitting device package after being mounted on a mold frame and a lead frame formed of a metal through a packaging process.

SUMMARY

Provided are light-emitting device packages including a bonding wire with high durability, and methods of manufacturing the light-emitting device packages.

Additional aspects will be set forth in part in the description which follows and, in part, will be apparent from the description, or may be learned by practice of the presented embodiments.

According to an aspect of the present invention, a light-emitting device package includes: a package body on which a mount portion and a terminal portion are disposed; a light-emitting device chip that is mounted on the mount portion; and a bonding wire that electrically connects an electrode of the light-emitting device chip and the terminal portion, wherein the bonding wire includes a rising portion that rises from the light-emitting device chip to a loop peak, and an extended portion that connects the loop peak and the terminal portion, wherein a first kink portion, which is bent in a direction intersecting a direction in which the rising portion rises, is disposed on the rising portion.

The extended portion may include a span portion that extends from the loop peak toward the terminal portion, and a falling portion that falls from the span portion toward the terminal portion and has an end portion bonded to the terminal portion, wherein a second kink portion, which is bent downward, is disposed on the span portion.

The bonding wire and the light-emitting device chip may be covered by a transparent encapsulation layer.

The package body may include an upper frame that forms a cavity, and a lead frame that constitutes a structure under the cavity and allows the mount portion and the terminal portion to be disposed thereon, wherein the bonding wire and the light-emitting device chip are covered by a transparent encapsulation layer that is filled in the cavity.

According to another aspect of the present invention, there is provided a light-emitting device package including: a light-emitting device chip; a terminal portion; a bonding wire that electrically connects the light-emitting device chip and the terminal portion; and a transparent encapsulation layer that covers the light-emitting device chip and the bonding wire, wherein the bonding wire includes a kink portion that is bent in a direction intersecting a direction in which the bonding wire extends.

The bonding wire may form a wire loop that connects the light-emitting device chip and the terminal portion, and the kink portion may be bent toward the inside of the wire loop.

The bonding wire may include a rising portion that rises from the light-emitting device to a loop peak, a span portion that extends from the loop peak toward the terminal portion, and a falling portion that falls from the span portion toward the terminal portion, wherein the kink portion is disposed on at least one of the rising portion and the span portion.

According to another aspect of the present invention, a method of manufacturing a light-emitting device package includes: mounting a light-emitting device chip on a mount portion of a package body; forming a first connection portion by lowering a capillary through which a wire is supplied and bonding an end portion of the wire to an electrode pad of the light-emitting device chip; raising the capillary along a rising path in order to form a shape of a bonding wire; forming a second connection portion by lowering the capillary toward a terminal portion of the package body and bonding another end portion of the wire to the terminal portion; and cutting off the wire, wherein the rising path includes at least one protruding path that is bent toward the terminal portion from a vertical reference line that passes through the first connection portion.

The bonding wire may include a rising portion that extends upward from the first connection portion toward a loop peak, and an extended portion that connects the loop peak and the terminal portion, wherein the rising path includes first and second rising paths respectively corresponding to the rising portion and the extended portion, wherein the protruding path is disposed on at least one of the first and second rising paths.

The extended portion may include a span portion that extends from the loop peak toward the terminal portion, and a falling portion that falls from the span portion toward the terminal portion and has an end portion bonded to the terminal portion, wherein the second rising path includes third and fourth rising paths respectively corresponding to the span portion and the falling portion, wherein the protruding path includes a first protruding path disposed on the first rising path, and a second protruding path disposed on the third rising path.

An end portion of the first rising path corresponding to the loop peak may be disposed on a side opposite to the terminal portion about the vertical reference line.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Hereinafter, embodiments of the present invention will be explained with reference to the attached drawings. In the drawings, like reference numerals denote like elements, and sizes or thicknesses of elements may be exaggerated for clarity.

Figure 1:
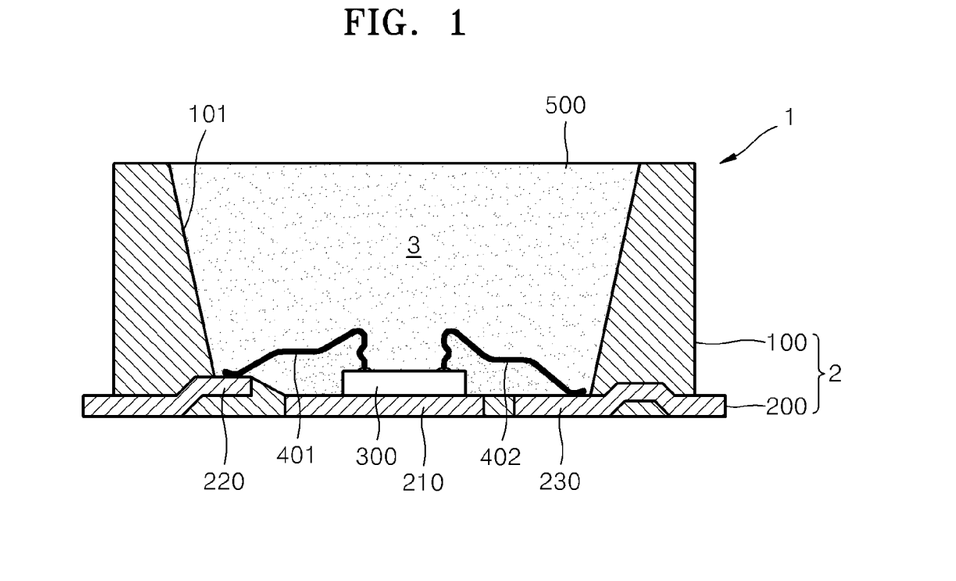
FIG. 1 is a cross-sectional view of a light-emitting device package according to an embodiment of the present invention.

FIG. 1 is a cross-sectional view of a light-emitting device package 1 according to an embodiment of the present invention. Referring to FIG. 1, the light-emitting device package 1 may include a package body 2 in which a cavity 3, in which a light-emitting device chip 300 is mounted, is formed.

The light-emitting device chip 300 may be a light-emitting diode (LED) chip. The LED chip may emit blue, green, and red light according to a material of a compound semiconductor that is used to form the LED chip. For example, a blue LED chip may include an active layer including a plurality of quantum well layers formed by alternately disposing GaN and InGaN, and a P-type clad layer and an N-type clad layer formed of a compound semiconductor of $Al_xGa_yN_z$ may be formed under and above the active layer. Also, the LED chip may emit ultraviolet (UV) light with no color. Although the light-emitting device chip 300 is an LED chip in FIG. 1, the present embodiment is not limited thereto. For example, the light-emitting device chip 300 may be a UV photodiode chip, a laser diode chip, an organic light-emitting diode chip.

The package body 2 may include a conductive lead frame 200 and an upper frame 100. The lead frame 200 may include a mount portion 210 on which the light-emitting device chip 300 is mounted, and first and second terminal portions 220 and 230 that are electrically connected to the light-emitting device chip 300 by using wire bonding. For example, the first and second terminal portions 220 and 230 may be connected to a cathode and an anode of the light-emitting device chip 300 by bonding wires 401 and 402, respectively. The first and second terminal portions 220 and 230 may be partially exposed beyond the upper frame 100 to function as terminals for supplying current to the light-emitting device chip 300. The lead frame 200 may be manufactured by pressing or etching a conductive metal plate material such as aluminum or copper.

The upper frame 100 may be a mold frame that is coupled to the lead frame 200 by using, for example, insert molding. The upper frame 100 may be formed of, for example, an electrically-insulating polymer. The upper frame 100 is formed in a concave shape through which the mount portion 210 and the first and second terminal portions 220 and 230 are exposed. Accordingly, the cavity 3 is formed in the package body 2. The mount portion 210 and the first and second terminal portions 220 and 230 constitute a structure under the cavity 3.

An inner surface 101 of the cavity 3 may be a reflective surface that reflects light emitted from the light-emitting device chip 300 to be emitted from the light-emitting device package 1. To this end, a material with a high light reflectance, for example, silver (Ag), aluminum (Al), platinum (Pt), titanium (Ti), chromium (Cr), or copper (Cu), may be coated or deposited on the inner surface 101. Alternatively, a plate formed of the aforesaid material may be bonded. Alternatively, at least a part of the inner surface 101 may be formed by the lead frame 200.

Accordingly, the light-emitting device package 1 is configured such that the light-emitting device chip 300 is disposed on a bottom surface of the cavity 3 that is substantially concave, and the inner surface 101 of the package body 2 functions as a reflective portion for reflecting light to be emitted to the outside of the light-emitting device package 1. The mount portion 210 and the first and second terminal portions 220 and 230 of the lead frame 200 may be exposed under the upper frame 100 to function as heat-emitting surfaces.

An encapsulation layer 500 formed of a transparent resin, such as silicon, is formed in the cavity 3 in order to protect the light-emitting device chip 300 and the bonding wires 401 and 402 from external influences. A fluorescent material for converting light emitted from the light-emitting device chip 300 into light with a desired color may be included in the encapsulation layer 500. The fluorescent material may consist of a single component or mixtures of two or more components.

Figure 2:
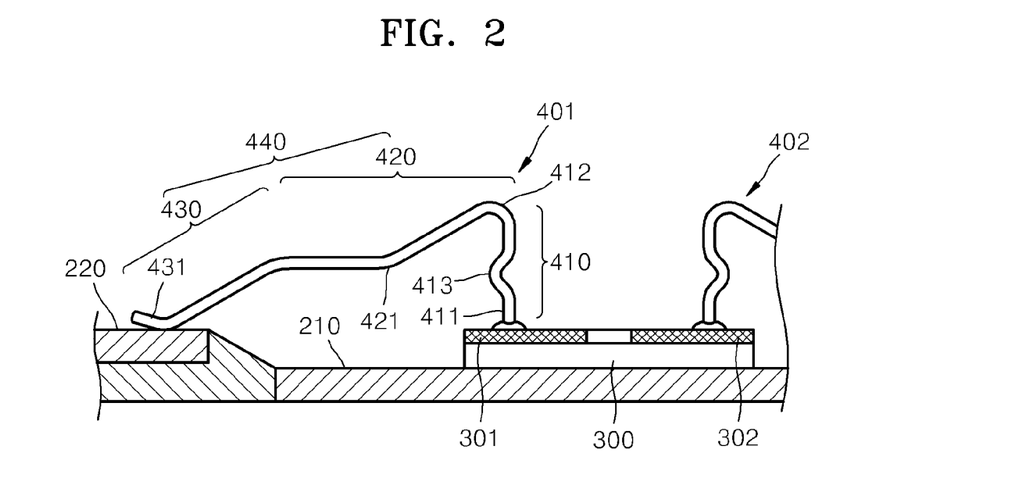
FIG. 2 is a detailed cross-sectional view illustrating a bonding wire of the light-emitting device package of FIG. 1.

FIG. 2 is a detailed cross-sectional view illustrating the bonding wire 401 that connects the light-emitting device chip 300 and the first terminal portion 220 of the light-emitting device package 1 of FIG. 1. Referring to FIG. 2, the bonding wire 401 includes a rising portion 410 that rises from the light-emitting device chip 300 toward a loop peak 412, and an extended portion 440 that extends from the loop peak 412 toward the first terminal portion 220 and has an end portion bonded to the first terminal portion 220. A first connection portion 411 of the rising portion 410, that is, an end portion of the rising portion 410 opposite to the loop peak 412, is bonded to the light-emitting device chip 300, especially, an anode pad 301 of the light-emitting device chip 300. A second connection portion 431, that is, an end portion of the extended portion 440, is bonded to the first terminal portion 220. Although the extended portion 440 includes a span portion 420 that extends from the loop peak 412 toward the first terminal portion 220, and a falling portion 430 that falls from the span portion 420 to the first terminal portion 220 in FIG. 2, the present embodiment is not limited thereto. As long as a second kink portion 421 may be formed, an area between the second kink portion 421 and the second connection portion 431 may have one or more straight or curved lines.

If the encapsulation layer 500 is formed in the entire cavity 3, the bonding wire 401 is buried in the encapsulation layer 500. Once the light-emitting device chip 300 starts operating, the bonding wire 401 and the encapsulation layer 500 are thermally expanded due to heat generated in the light-emitting device chip 300. In this case, due to a difference in thermal expansion coefficient between the bonding wire 401 and the encapsulation layer 500, a stress is applied to the bonding wire 401. This also happens when the light-emitting device chip 300 stops operating and is cooled. If an expansion stress and a compressive stress are repeatedly applied due to a difference in thermal expansion coefficient between the bonding wire 401 and the encapsulation layer 500, the first and second connection portion 411 and 431 are forced to be separated from the electrode pad 301 and the first terminal portion 220, respectively. Also, the bonding wire 401 may is broken due to a stress caused by a difference in thermal expansion coefficient between the bonding wire 401 and the encapsulation layer 500.

In order to reduce the risk of wire breakage due to a stress applied to the bonding wire 401, the light-emitting device package 1 includes a kink portion for reducing a stress applied to the bonding wire 401. The term 'kink' means a shape that is bent. The kink portion is bent in a direction intersecting a direction in which the bonding wire 401 extends. The kink portion may be disposed at a plurality of places of the bonding wire 401.

Referring to FIG. 2, the kink portion may include a first kink portion 413 disposed on the rising portion 410. The first kink portion 413 is bent in a direction intersecting a direction in which the rising portion 410 rises. The first kink portion 413 is bent in a direction in which the extended portion 440 extends, that is, toward the first terminal portion 413. The first kink portion 413 is bent toward the inside of a wire loop formed by the bonding wire 401.

Figure 3:
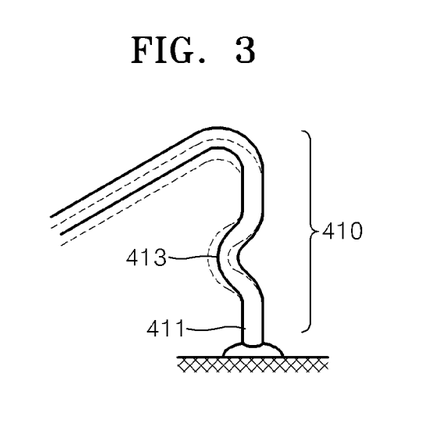
FIG. 3 is a view illustrating a movement of a first kink portion when a compressive stress is applied.
Figure 4:
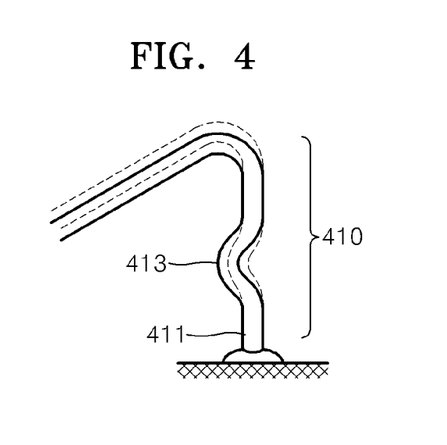
FIG. 4 is a view illustrating a movement of the first kink portion when an expansion stress is applied.

If the light-emitting device chip 300 repeatedly starts and stops operating, an expansion stress and a compressive stress are repeatedly applied to the bonding wire 401. FIG. 3 is a cross-sectional view illustrating a movement of the first kink portion 413 when a compressive stress is applied. Referring to FIG. 3, when a compressive stress is applied to the bonding wire 401, the first kink portion 413 absorbs the compressive stress by being contracted as shown by a dotted line. FIG. 4 is a cross-sectional view illustrating a movement of the first kink portion 413 when an expansion stress is applied. Referring to FIG. 4, when an expansion stress is applied to the bonding wire 401, the first kink portion 413 absorbs the expansion stress by being expanded as shown by a dotted line. In FIGS. 3 and 4, a compressive stress and an expansion stress are simply vertically applied to the bonding wire 401 for convenience of explanation. However, since the compressive stress and the expansion stress are applied to the entire bonding wire 401, it would be understood by one of ordinary skill in the art that the bonding wire 401 may be actually deformed in a different shape from that shown in FIGS. 3 and 4. For example, although not shown, when a compressive stress is applied, the first kink portion 413 may be contracted such that an area between the first kink portion 413 and the loop peak 412 is inclined in a direction in which the extended portion 440 extends, that is, toward the first terminal portion 220. When an expansion stress is applied, the first kink portion 413 may be expanded such that the area between the first kink portion 413 and the loop peak 412 may be inclined in a direction opposite to the direction in which the extended portion 440 extends.

As described above, since the first kink portion 413 functions as a buffer portion that may respond to an expansion stress and a compressive stress and help the bonding wire 401 to be appropriately deformed, breakage of the bonding wire 401 itself may be reduced. Also, since an expansion stress and a compressive stress are absorbed, the risk that the first and second connection portions 411 and 431 are respectively separated from the light-emitting device chip 300 and the first terminal portion 220 may be reduced.

The kink portion may further include a second kink portion 421 disposed on the extended portion 440. The second kink portion 421 is disposed on the span portion 420 in FIG. 2. The second kink portion 421 is bent in a direction intersecting a direction in which the extended portion 440 extends. The second kink portion 421 is bent downward, that is, is bent toward the inside of a wire loop formed by the bonding wire 401 in FIG. 2. When an expansion stress is applied, the second kink portion 421 is expanded as shown by a dotted line of FIG. 5, and when a compressive stress is applied, the second kink portion 421 is contracted as shown by a dotted line of FIG. 6. As such, since the second kink portion 421 functions as a buffer portion that may respond to a compressive stress and an expansion stress and help the bonding wire 401 to be appropriately deformed, breakage of the bonding wire 401 itself may be reduced. Also, the risk that the first and second connection portions 411 and 431 are respectively separated from the light-emitting device chip 300 and the first terminal portion 220 may be reduced.

Figure 5:
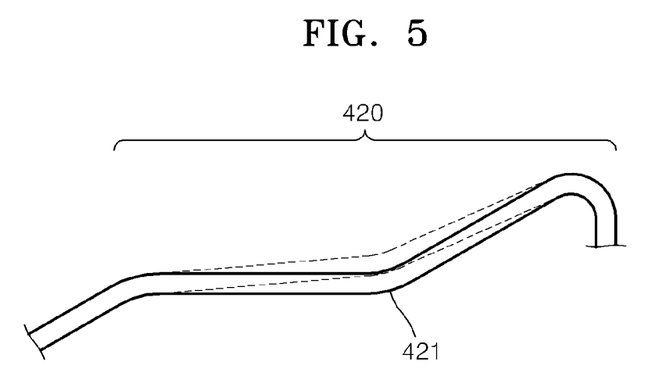
FIG. 5 is a view illustrating a movement of a second kink portion when an expansion stress is applied.
Figure 6:
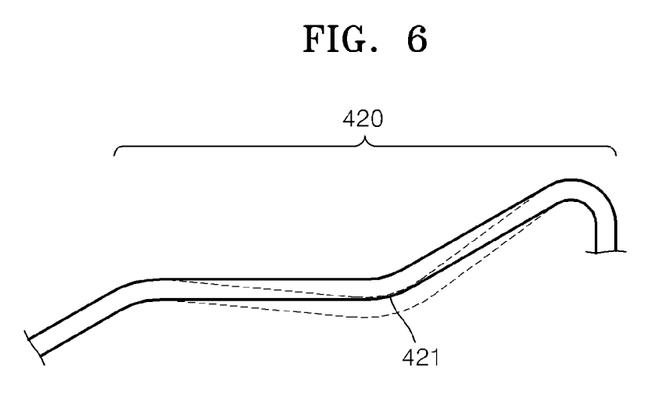
FIG. 6 is a view illustrating a movement of the second kink portion when a compressive stress is applied.

In FIGS. 5 and 6, a compressive stress and an expansion stress are simply horizontally applied to the bonding wire 401 for convenience of explanation. However, it would be understood by one of ordinary skill in the art that the bonding wire 401 may actually be deformed in a different shape from that shown in FIGS. 5 and 6. For example, when a compressive stress is applied to the entire bonding wire 401, the first kink portion 413 may be contracted such that an area between the first kink portion 413 and the loop peak 412 is inclined in a direction in which the extended portion 440 extends. In this case, the second kink portion 421 may be contracted as shown by a dotted line of FIG. 6. Also, when an expansion stress is applied, the first kink portion 413 may be expanded such that the area between the first kink portion 413 and the loop peak 412 is inclined in a direction opposite to the direction in which the extended portion 440 extends. In this case, the second kink portion 421 may be expanded as shown by a dotted line of FIG. 5. As such, since the first kink portion 413 and the second kink portion 421 respond to a compressive stress or an expansion stress and are contracted or expanded to absorb the stress, breakage of the bonding wire 401 itself or the risk that the first and second connection portions 411 and 431 are respectively separated from the light-emitting device chip 300 and the first terminal portion 220 may be reduced.

The kink portion may have a shape that is bent toward the inside of a wire loop in order to minimize a space occupied by the wire loop formed by the bonding wire 401, but the present embodiment is not limited thereto. The kink portion may have a shape that is bent toward the outside of the wire loop or is bent toward both the inside and the outside of the wire loop. Although one first kink portion 413 and one second kink portion 421 are disposed on the bonding wire 401 in FIG. 2, the present embodiment is not limited thereto. If needed, two or more first and second kink portions 413 and 421 may be disposed. The buffering operation of the kink portion may be very effective when a loop height, that is, a height from the light-emitting device chip 300 to the loop peak 412, is equal to or greater than about 200 μm.

Although an expansion stress and a compressive stress are reduced by using the kink portion in the above embodiments, the present invention is not limited thereto. An expansion stress and a compressive stress may also be generated by a external impact applied to the light-emitting device package 1, and the kink portion may reduce the risk of breakage of the bonding wire 401 and separation of the first and second connection portions 411 and 431 by reducing a stress due to the external impact by using the operation as described above.

Although the bonding wire 401 connected to the first terminal portion 220 is explained in the above, the same explanation applies to the bonding wire 402 connected to the second terminal portion 230.

A method of manufacturing the light-emitting device package 1 will now be explained.

First, the lead frame 200 on which the mount portion 210 and the first and second terminal portions 220 and 230 are disposed is formed by pressing or etching a metal plate material such as aluminum or copper. Cleaning may be performed in order to remove impurities on the lead frame 200 before injection molding that will be explained later. Plating may also be performed in order to modify a surface of the lead frame 200. The upper frame 100 is coupled to the lead frame 200. The upper frame 100 may be formed on the lead frame 200 by using insert molding or the like using a polymer such as polyphthal amide (PPA) or liquid crystal polymer (LCP). Accordingly, as shown in FIG. 1, the package body 2 in which the cavity 3 is formed is obtained. The lead frame 200 constitutes a structure under the cavity 3. The light-emitting device chip 300 is mounted on the mount portion 210. The light-emitting device chip 300 may be attached to the mount portion 210 by using, for example, an adhesive.

Figure 7:
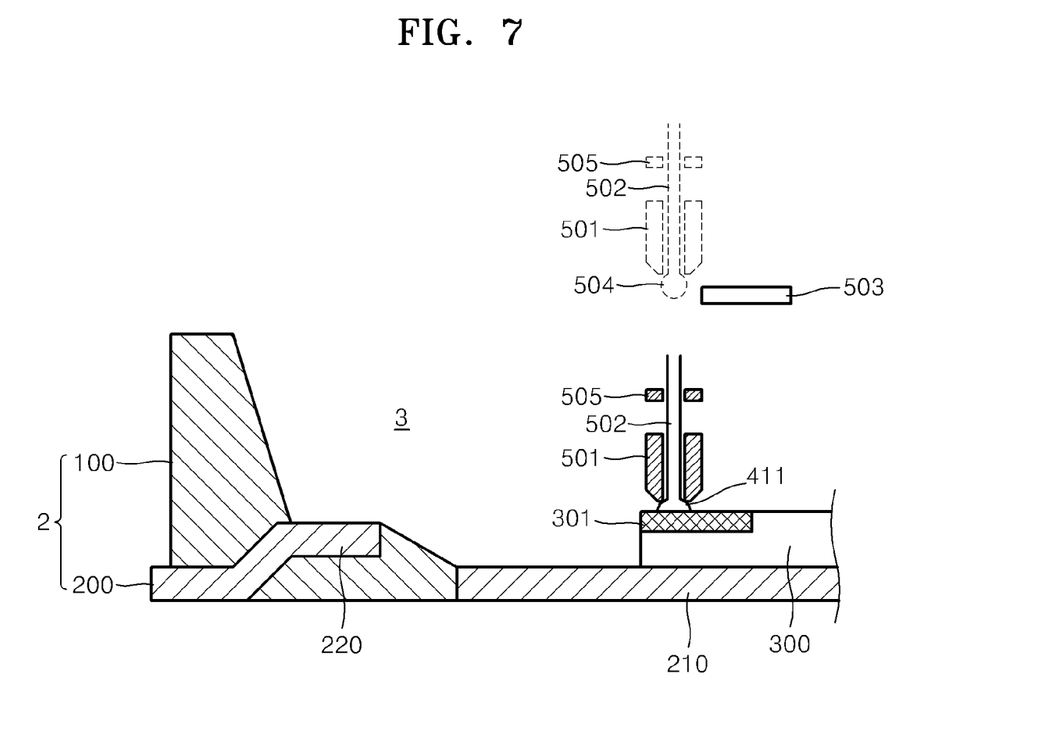
FIG. 7 is a cross-sectional view for explaining a method of manufacturing the light-emitting device package, according to an embodiment of the present invention, illustrating a case where a first connection portion is formed by bonding a wire to an electrode pad of a light-emitting device chip.

FIG. 7 is a cross-sectional view for explaining a method of manufacturing the light-emitting device package 1 including the bonding wire 401 having a shape shown in FIG. 2.

Referring to FIG. 7, a conductive material, such as gold or copper, is supplied through a capillary 501 in the form of a wire 502. A clamp 505 selectively allows or blocks the supply of the wire 502.

As shown by a dotted line of FIG. 7, an end portion of the wire 502 is melted by bringing a discharge electrode 503 or a heating unit close to the end portion of the wire 502 supplied through the capillary 501. Then, a ball 504 is formed on the end portion of the wire 502. Then, in a state where the clamp 505 is opened in order to allow the supply of the wire 502, the capillary 501 is lowered to make the ball 504 contact the electrode pad 301. In this state, the first connection portion 411 is formed by applying an appropriate load and ultrasonic vibration to make the ball 504 bond the electrode pad 301.

Next, the capillary 501 is raised in order to form a shape of the bonding wire 401.

Figure 8:
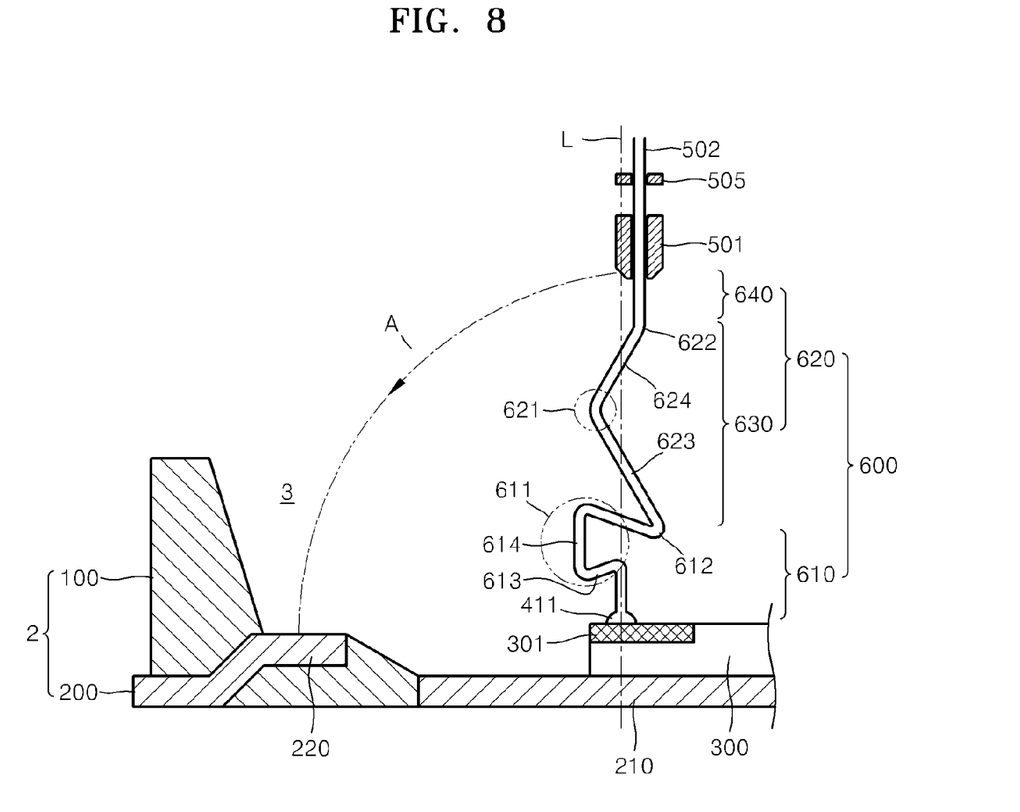
FIG. 8 is a cross-sectional view for explaining the method of FIG. 7, illustrating a rising path of a capillary for forming a shape of a bonding wire.

FIG. 8 is a cross-sectional view for explaining the method of manufacturing the light-emitting device package 1, illustrating a rising path 600 of the capillary 501. As shown in FIG. 8, the capillary 501 is raised to form a shape of the bonding wire 401. While the capillary 501 is raised, the clamp 505 is maintained open to allow the supply of the wire 502.

The rising path 600 of the capillary 501 may include first and second rising paths 610 and 620. The first and second rising paths 610 and 620 may be paths for forming the rising portion 410 and the extended portion 440, respectively. The second rising path 620 may include third and fourth rising paths 630 and 640 respectively corresponding to the span portion 420 and the falling portion 430. The rising path 600 of the capillary 501 includes at least one protruding path protruding toward the first terminal portion 220 from a vertical reference line L that passes through the first connection portion 411.

Referring to FIG. 8, a first protruding path 611 protruding toward the first terminal portion 220 from the vertical reference line L is disposed on the first rising path 610. The first protruding path 611 is for forming the first kink portion 413. The first protruding path 611 may be formed by a path 613 that extends toward the first terminal portion 220 from the vertical reference line L, and a path 614 that extends upward from the path 613. The path 614 does not have to be parallel to the vertical reference line L. An end portion 612 of the first rising path 610 corresponds to the loop peak 412. After bonding is completed, if the loop peak 412 is inclined toward the first terminal portion 220, the bonding wire 401 may be downwardly bent, to contact the lead frame 200. Accordingly, in order to prevent the loop peak 412 from being inclined toward the first terminal portion 220 after bonding is completed, the end portion 612 of the first rising path 610 is located at a side opposite to the first terminal portion 220 about the vertical reference line L.

Referring back to FIG. 8, a second protruding path 621 protruding toward the first terminal portion 220 from the vertical reference line L is disposed on the second rising path 620, especially, on the third rising path 630. The second protruding path 621 is for forming the second kink portion 421. The second protruding portion 621 may include a path 623 that obliquely rises toward the first terminal portion 220 from the end portion 612 corresponding to the loop peak 412, and a path 624 that obliquely rises in a direction opposite to the first terminal portion 220 from the path 623. An end portion 622 of the third rising path 630 becomes a connection portion between the span portion 420 and the falling portion 430.

Figure 9:
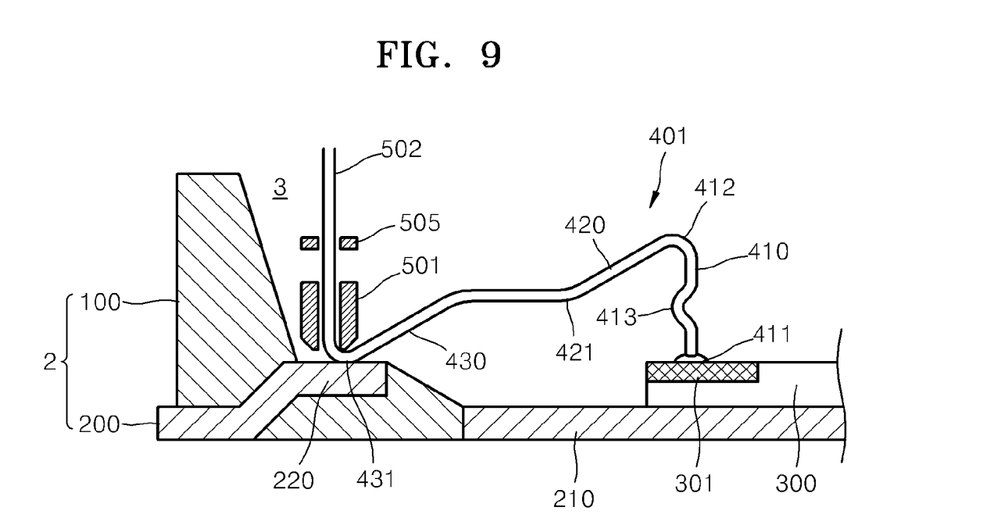
FIG. 9 is a cross-sectional view for explaining the method of FIG. 7, illustrating a case where a second connection portion is formed by bonding a wire to a terminal portion of a lead frame.

When the capillary 501 is no longer raised, the capillary 501 is lowered toward the first terminal portion 220 along a curved track indicated by an arrow A of FIG. 8. While the capillary 501 is lowered, the clamp 505 is maintained closed to block the supply of the wire 502. When the capillary 501 is lowered, a part of the wire 502 of the first and second rising paths 610 and 620 is expanded, and when the wire 502 contacts the first terminal portion 220, a shape of the bonding wire 401 including the first and second kink portions 413 and 421 is formed as shown in FIG. 9. In this state, the second connection portion 431 is formed by applying an appropriate load and ultrasonic vibration to bond the wire 502 to the first terminal portion 220.

Figure 10:
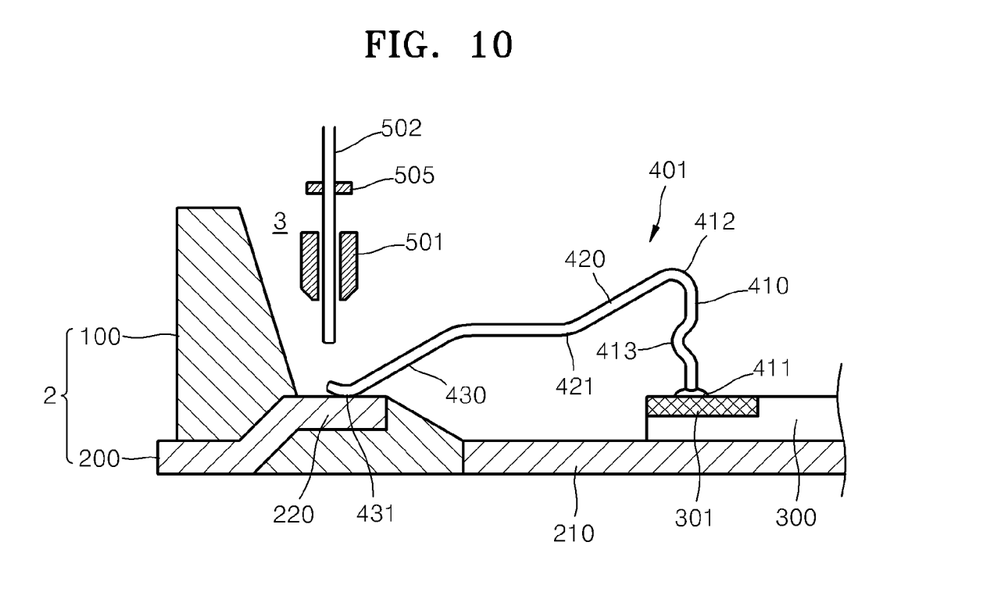
FIG. 10 is a cross-sectional view for explaining the method of FIG. 7, illustrating a case where the wire is cut off after the second connection portion is formed.

Next, as shown in FIG. 10, when the capillary 501 is raised while being clamped, the wire 502 is cut off, thereby completing a bonding process of connecting the bonding wire 401.

A bonding process of connecting the bonding wire 402 to the second terminal portion 230 and the cathode pad 302 of the light-emitting device chip 300 will be performed in the same manner as that described above.

When both the bonding processes are completed, a process of forming the encapsulation layer 500 in the cavity 3 may be performed. The encapsulation layer 500 may be formed by injecting a transparent resin, for example, transparent silicon, into the cavity 3 and drying and curing the transparent resin. A fluorescent material for converting light emitted from the light-emitting device chip 300 into light with a desired color may be dispersed in the encapsulation layer 500. The encapsulation layer 500 may be formed by filling the transparent resin in which the fluorescent material is dispersed in the cavity 3 and drying and curing the transparent resin.

The light-emitting device package 1 including the bonding wires 401 and 402 on which at least one kink portion is disposed may be manufactured by using the afore-described method.

Although the light-emitting device package including the package body 2 in which the cavity 3 is formed and the method of manufacturing the light-emitting device package 1 are explained in the above embodiments, the present invention is not limited to the embodiments of the light-emitting device package 1 and the method of manufacturing the light-emitting device package 1 shown in FIGS. 1 through 10. For example, one of the anode pad 301 and the cathode pad 302 of the light-emitting device chip 300, for example, the cathode pad 302, may be located under the light-emitting device chip 300 to be directly electrically connected to the mount portion 210. That is, the mount portion 210 may also function as the second terminal portion 230. In this case, the anode pad 301 and the first terminal portion 220 of the light-emitting device chip 300 may be electrically connected to each other by using the bonding wire 401. Also, for example, the light-emitting device package 1 does not have to include the cavity 3. The light-emitting device package 1 may be configured such that the light-emitting device chip 300 is mounted on the mount portion 210 of the lead frame 200, the light-emitting device chip 300 and the terminal portions 220 and 230 are connected by using the bonding wires 401 and 402, and the transparent encapsulation layer 500 covering the light-emitting device chip 300 and the bonding wires 401 and 402 is formed.

In this case, the package body 2 may be formed by the lead frame 200, and the upper frame 100 may be omitted. Also, the package body 2 may be formed by both the lead frame 200 and the upper frame 100 that supports the lead frame 200. That is, as long as a package body includes a mount portion on which a light-emitting device is mounted and at least one terminal portion, the present invention is not limited to the type or structure of the package body.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A light-emitting device package comprising:
a package body on which a mount portion and a terminal portion are disposed;
a light-emitting device chip that is mounted on the mount portion; and
a bonding wire that electrically connects an electrode of the light-emitting device chip and the terminal portion,
wherein the bonding wire comprises a rising portion that rises from the light-emitting device chip to a loop peak, and an extended portion that connects the loop peak and the terminal portion,
wherein a first kink portion, which is bent in a direction intersecting a direction in which the rising portion rises, is disposed on the rising portion,
wherein the extended portion comprises a span portion that extends from the loop peak toward the terminal portion, and a falling portion that falls from the span portion toward the terminal portion and has an end portion bonded to the terminal portion,
wherein a second kink portion, which is bent downward and toward an inside of a wire loop formed by the bonding wire, is disposed on the span portion between the loop peak and an intersection of the span portion and the falling portion, and
wherein the first kink portion, after being bent, and the second kink portion, after being bent, contracts or expands in response to a compressive stress or an expansion stress to absorb the respective stress.

2. The light-emitting device package of claim 1, wherein the bonding wire and the light-emitting device chip are covered by a transparent encapsulation layer.

3. The light-emitting device package of claim 1, wherein the package body comprises an upper frame that forms a cavity, and a lead frame that constitutes a structure under the cavity and allows the mount portion and the terminal portion to be disposed thereon,
wherein the bonding wire and the light-emitting device chip are covered by a transparent encapsulation layer that is filled in the cavity.

4. The light-emitting device package of claim 1, wherein the span portion comprises a first portion which is inclined downward and toward the terminal portion, and a second portion which is not inclined and extends toward the terminal portion.

5. The light-emitting device package of claim 4, wherein the second kink portion is disposed at an intersection of the first portion and the second portion.

6. A light-emitting device package comprising:
a light-emitting device chip;
a terminal portion;
a bonding wire that electrically connects the light-emitting device chip and the terminal portion; and
a transparent encapsulation layer that covers the light-emitting device chip and the bonding wire,
wherein the bonding wire comprises a first kink portion that is bent in a direction intersecting a direction in which the bonding wire extends,
wherein the bonding wire forms a wire loop that connects the light-emitting device chip and the terminal portion, and the first kink portion is bent toward the inside of the wire loop,
wherein the bonding wire comprises a rising portion that rises from the light-emitting device to a loop peak, a span portion that extends from the loop peak toward the terminal portion, and a falling portion that falls from the span portion toward the terminal portion,
wherein the first kink portion is disposed on at least one of the rising portion and the span portion,
wherein a second kink portion, which is bent downward and toward the inside of the wire loop formed by the bonding wire, is disposed on the span portion between the loop peak and an intersection of the span portion and the falling portion, and
wherein the first kink portion, after being bent, and the second kink portion, after being bent, contracts or expands in response to a compressive stress or an expansion stress to absorb the respective stress.

7. A method of manufacturing a light-emitting device package, the method comprising:
mounting a light-emitting device chip on a mount portion of a package body;
forming a first connection portion by lowering a capillary through which a wire is supplied and bonding an end portion of the wire to an electrode pad of the light-emitting device chip;
raising the capillary along a rising path in order to form a shape of a bonding wire;
forming a second connection portion by lowering the capillary toward a terminal portion of the package body and bonding another end portion of the wire to the terminal portion; and
cutting off the wire,
wherein the rising path comprises at least one protruding path that is bent toward the terminal portion from a vertical reference line that passes through the first connection portion,
wherein the bonding wire comprises a rising portion that extends upward from the first connection portion toward a loop peak, and an extended portion that connects the loop peak and the terminal portion,
wherein the rising path comprises first and second rising paths respectively corresponding to the rising portion and the extended portion,
wherein the at least one protruding path is disposed on at least one of the first and second rising paths, wherein the extended portion comprises a span portion that extends from the loop peak toward the terminal portion, and a falling portion that falls from the span portion toward the terminal portion and has an end portion bonded to the terminal portion, wherein the second rising path comprises third and fourth rising paths respectively corresponding to the span portion and the falling portion, wherein the at least one protruding path comprises a first protruding path being bent and disposed on the first rising path, and a second protruding path disposed on the third rising path, wherein the second protruding path, which is bent downward and toward the inside of a wire loop formed by the bonding wire, is disposed on the span portion between the loop peak and an intersection of the span portion and the falling portion, and wherein the first protruding path, after being bent, and the second protruding path, after being bent, contracts or expands in response to a compressive stress or an expansion stress to absorb the respective stress.

8. The method of claim 7, wherein an end portion of the first rising path corresponding to the loop peak is disposed on a side opposite to the terminal portion about the vertical reference line.

* * * * *